United States Patent
Hu et al.

(10) Patent No.: US 6,584,417 B1
(45) Date of Patent: Jun. 24, 2003

(54) METHOD AND DIRECTIONAL ELEMENT FOR FAULT DIRECTION DETERMINATION IN A CAPACITANCE-COMPENSATED LINE

(75) Inventors: Yi Hu, Cary, NC (US); Damir Novosel, Cary, NC (US); David G. Hart, Raleigh, NC (US)

(73) Assignee: ABB Inc., Raleigh, NC (US)

( * ) Notice: Subject to any disclaimer, the term of this patent is extended or adjusted under 35 U.S.C. 154(b) by 0 days.

(21) Appl. No.: 09/425,661

(22) Filed: Oct. 22, 1999

(51) Int. Cl.$^7$ ............................................... G01R 31/08
(52) U.S. Cl. ............................ 702/58; 702/59; 361/522
(58) Field of Search .............................. 702/58, 59, 60, 702/62, 64, 65, 72, 117, 118, 122, 124, 126, 182–185, 188, 189, FOR 103–106, FOR 111, FOR 112, FOR 114, FOR 134, FOR 135, FOR 170, FOR 171; 361/84, 78, 79, 80, 77, 82; 324/543, 539, 512, 522

(56) References Cited

U.S. PATENT DOCUMENTS

| | | | | |
|---|---|---|---|---|
| 3,878,460 A | * | 4/1975 | Nimmersjo | 324/520 |
| 4,090,226 A | * | 5/1978 | Fahlen et al. | 361/16 |
| 4,251,766 A | * | 2/1981 | Souillard | 324/521 |
| 4,325,098 A | * | 4/1982 | Heller | 361/82 |
| 5,355,076 A | * | 10/1994 | Chadwick | 323/208 |
| 5,808,845 A | * | 9/1998 | Roberts | 361/79 |
| 5,956,220 A | * | 9/1999 | Novosel et al. | 361/62 |
| 6,028,754 A | * | 2/2000 | Guzman-Casillas et al. | 361/89 |

* cited by examiner

Primary Examiner—Marc S. Hoff
Assistant Examiner—Paul Kim
(74) Attorney, Agent, or Firm—Woodcock Washburn LLP (57) ABSTRACT

An electrical power system includes a transmission line for transmitting electrical power, series capacitance compensation series-coupled to the transmission line adjacent one end thereof, where the series compensation includes a capacitance having a value $(-j\, X_{CAP})$, and a protective relay at the one end of the transmission line for monitoring line voltages and line currents on the transmission line. Upon sensing a fault, an impedance Z of the line is calculated based on the monitored line voltages and line currents. The calculated impedance Z is adjusted according to the value of the capacitance of the series compensation $(-j\, X_{CAP})$ to result in a modified impedance $Z_{MOD}$, and the phasor angle Of $Z_{MOD}$ is examined to determine the direction of the sensed fault. The fault is in a first direction if the phasor angle is between X and X+180 degrees and is in a second direction opposite the first direction if the phasor angle is between X+180 and X+360 degrees.

18 Claims, 5 Drawing Sheets

METHOD AND DIRECTIONAL ELEMENT FOR FAULT DIRECTION DETERMINATION IN A CAPACITANCE-COMPENSATED LINE

FIELD OF THE INVENTION

The present invention relates generally to protective relaying in a power transmission and/or distribution system, and more particularly to a method for use in connection with a protective relay or like device to accurately determine fault direction in a capacitance-compensated line of such a power system.

BACKGROUND OF THE INVENTION

Figure 1:
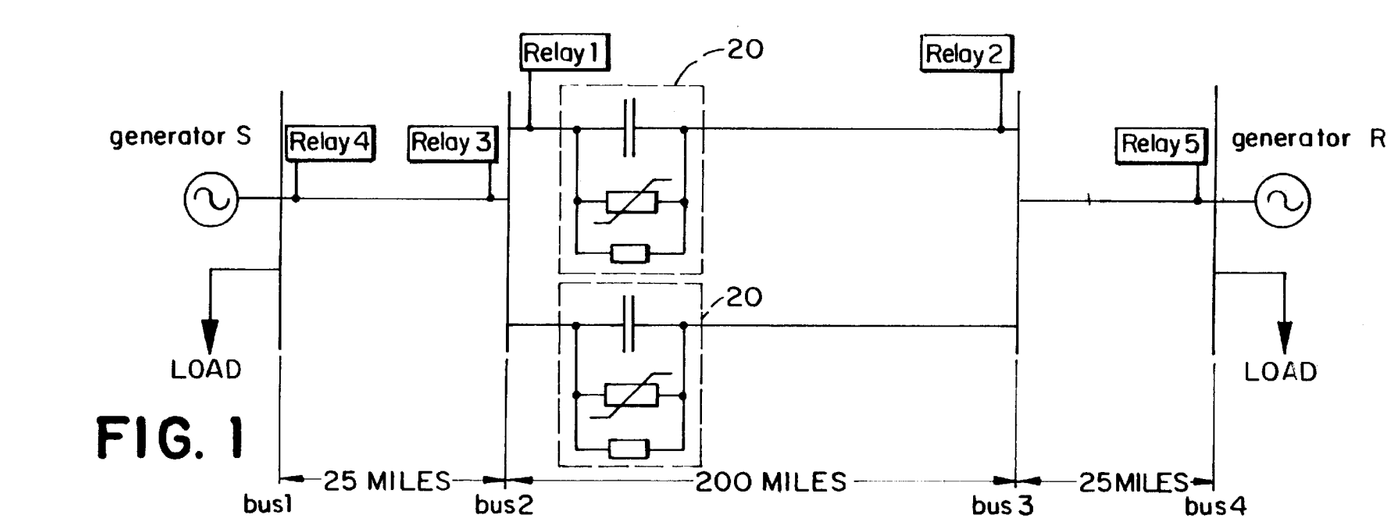
FIG. 1 is a schematic diagram of a power distribution system having protective relays which perform fault direction determination in accordance with a preferred embodiment of the present invention.

In a power distribution system, electrical transmission lines and power generation equipment must be protected against faults and consequent short circuits. Otherwise, such faults and short circuits can cause a collapse of the system, equipment damage, and/or personal injury. Accordingly, and as shown in FIG. 1, a typical power system employs a protective relay at each end of a transmission line to monitor system conditions on and adjacent such protected transmission line, to sense faults and short circuits on and adjacent such protected line, and to appropriately isolate such faults and short circuits from the remainder of the power system by tripping pre-positioned circuit breakers on such protected line.

As seen, a typical power system can be connected over hundreds of miles and include multiple power generators (generator S, generator R) at different locations. Transmission lines (the main horizontal lines in FIG. 1) distribute power from the generators to secondary lines or buses (the main vertical lines in FIG. 1), and such buses eventually lead to power loads such as motors, houses, office buildings, manufacturing facilities, industrial plants, cities, etc. Importantly, relays and circuit breakers are appropriately positioned at each end of a protected transmission line to perform the isolating function described above.

A modern protective relay typically measures voltage and current waveforms measured at the respective end of a corresponding protected line, and employs a microprocessor and/or digital signal processor (DSP) to process the measured waveforms. As used herein, the term 'transmission line' includes any type of electrical conductor, such as a high power conductor, a feeder, etc. Based on the processed waveforms, the protective relay can then decide whether to trip an associated breaker, thereby isolating a portion of the power system.

Figure 1A:
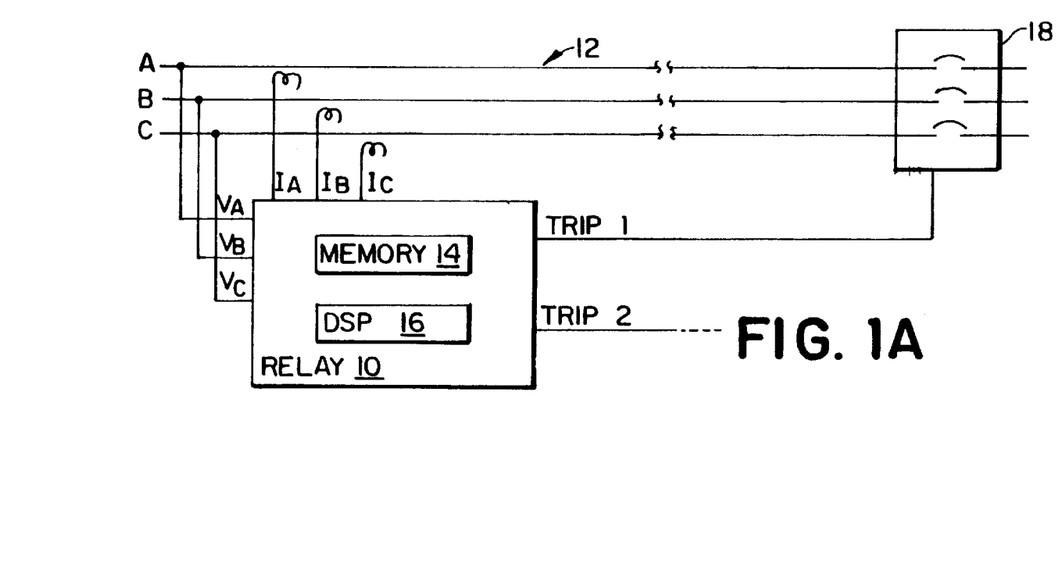
FIG. 1A is a schematic diagram of a relay employed in connection with the power system shown in FIG. 1, where the relay is coupled to a circuit breaker in accordance with a preferred embodiment of the present invention.

In particular, and referring now to FIG. 1A, it is seen that a typical protective relay 10 samples voltage and current waveforms $V_A$, $V_B$, $V_C$, $I_A$, $I_B$, $I_C$ from each phase (A–C) of a three phase line 12 at a particular point along such line 12. Of course, the line 12 may have greater or lesser numbers of phases, and greater or lesser numbers of phases in a line 12 may be sampled. The sampled waveforms are stored in a memory 14 and may then be retrieved and appropriately operated on by a processor or DSP 16 to produce estimated voltage, current, and impedance phasors. As should be understood, such phasors merely express such values in complex form according to magnitude and angle. As should also be understood, such impedance phasors in particular are employed to determine whether a fault condition exists, and if so to determine fault direction and estimate fault location, among other things.

Based on the determined fault direction and estimated fault location, then, the relay 10 may decide that a detected fault is on the line 12 protected by such relay 10 or is otherwise within the 'zone of protection' of such relay 10, and that an associated circuit breaker 18 should be tripped to isolate the faulted line 12. Accordingly, such relay 10 issues an appropriate command to the circuit breaker 10.

Typically, the command is issued over a 'TRIP' output of the relay 10 ('TRIP 1' in FIG. 1A) and is appropriately received as an input to the circuit breaker 18. The relay 10 may then reset the circuit breaker 18 (by appropriate means) after the relay 10 senses that the fault has been cleared, or after otherwise deciding or being ordered to do so. Notably, the relay 10 may control several circuit breakers 18 (only one being shown in FIG. 1A), hence the 'TRIP 2' output (additional 'TRIP' outputs not being shown in FIG. 1A). Additionally, the circuit breakers 18 may be arranged to control one or more specific phases of the line 12, rather than all of the phases of the line 12. Owing to the relatively large distances over which a power system can extend, the distance between a relay 10 and one or more of its associated circuit breakers 18 can be substantial. As a result, the outputs from the relay 10 may be received by the circuit breaker(s) 18 by way of any reasonable transmission method, including hard wire line, radio transmission, optical link, satellite link, the transmission lines 12 themselves, and the like. Moreover, the commands may be transmitted and received as packetized network signals or the like on a data network rather than as signals on dedicated lines.

Figure 2:
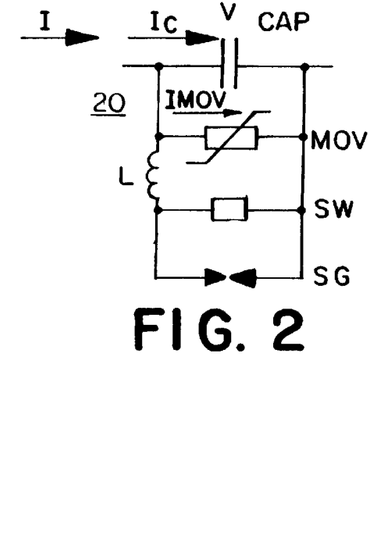
FIG. 2 is a schematic diagram of a representative series capacitor and related elements employed in connection with the power system shown in FIG. 1.

As seen in FIGS. 1 and 2, a transmission line, and in particular a relatively long transmission line, is oftentimes series-compensated by the installation of series capacitance 20 in the form of one or more capacitors or banks of capacitors (a representative series capacitor CAP is shown) at or adjacent one end of such line or perhaps even toward the middle of the line. Benefits obtained thereby include increased power transfer capability, improved system stability, reduced system losses, improved voltage regulation, and better power flow regulation. However, such installation of series capacitance 20 introduces challenges to protection systems for both the series-compensated line and lines adjacent thereto.

Typically, and as best seen in FIG. 2, installed series capacitance 20 includes a metal oxide varistor (MOV) or other non-linear protection device in parallel with the series capacitance (CAP), which limits the voltage across the capacitance in a pre-defined manner. Additionally, a bypass breaker or bypass switch (SW) is installed in parallel with the series capacitance, which closes following operation of a series capacitance overload protection system (not shown). The closing of such breaker introduces a transient in the system as the breaker arcs and the impedance seen by the protective relay is altered. In particular, the quick response of the MOV and overload protection (the spark gap (SG) installed in parallel with the series capacitance) removes or reduces the capacitance (CAP) and limits the impact of the transient.

Protection of a power distribution system with one or more series compensated lines is considered to be one of the most difficult tasks both for relay designers and utility engineers. A protective relay should be designed to have a high level of security and dependability. A utility engineer should be able to set the protection properly. However, protection settings depend on prevailing system conditions and system configuration, and both may change significantly if series capacitance is present in the system. In particular, such changes result from, among other things, the fact that series capacitance installed within a power system introduces an impedance that must be taken into account when measuring line impedance. More particular, and as is relevant in the present disclosure, the series capacitance and the fact that such series capacitance can vary must be taken into account during determination of fault direction.

SUMMARY OF THE INVENTION

In the present invention, accurate fault direction determination is accomplished by compensating fault direction-detecting elements for added series capacitance. In particular, in the present invention, an electrical power system includes a transmission line for transmitting electrical power, series capacitance compensation series-coupled to the transmission line adjacent one end thereof, where the series compensation includes a capacitance having a value $(-j\ X_{CAP})$, and a protective relay at the one end of the transmission line for monitoring line voltages and line currents on the transmission line.

Upon sensing a fault, an impedance Z of the line is calculated based on the monitored line voltages and line currents. The calculated impedance Z is adjusted according to the value of the capacitance of the series compensation $(-j\ X_{CAP})$ to result in a modified impedance $Z_{MOD}$, and the phasor angle of $Z_{MOD}$ is examined to determine the direction of the sensed fault. The fault is in a first direction if the phasor angle is between X and X+180 degrees, and is in a second direction opposite the first direction if the phasor angle is between X+180 and X+360 degrees.

BRIEF DESCRIPTION OF THE DRAWINGS

The foregoing summary, as well as the following detailed description of preferred embodiments of the present invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF PREFERRED EMBODIMENTS

The following detailed description of presently preferred embodiments of the invention considers fault direction determination in connection with a transmission line 12. In particular, the present invention includes a new compensated direction determination method and a new directional element for series compensated line protection. However, such method and directional element is not restricted to use in connection with a transmission line 12 and may instead be employed in connection with other power system elements without departing from the spirit and scope of the present invention.

Certain terminology may be used in the following description for convenience only and is not considered to be limiting. The words "left", "right", "upper", and "lower" designate directions in the drawings to which reference is made. The words "forward" and "reverse" are further directions toward and away from, respectively, a respective power line. The terminology includes the words above specifically mentioned, derivatives thereof, and words of similar import.

As is known, a protective relay 10, 'looks' in a particular line direction, which for purposes of the present invention is down the line 12 protected thereby. Accordingly, such relay 10 measures line impedance by sampling line voltage and line current values and then dividing line voltage by line current. For example, and referring now to FIG. 3A, absent any series compensation 20, the relay 10 looking to the right measures a voltage V and a (positive) current I on the line L, and arrives at a positive line impedance Z=V/I. As should be understood, because the primary load (shown) is to the right, the line current I through the line L is presumed for present purposes to be predominantly produced by the generator S at the left and flows right. Accordingly, the line voltage V and the line current I are by convention positive (based on the relay 10 looking to the right), as is the measured line impedance Z. As should also be understood, the measured line impedance is based primarily on the line L, but also takes into account the fact that the power system extends beyond the line L.

Figure 3A:
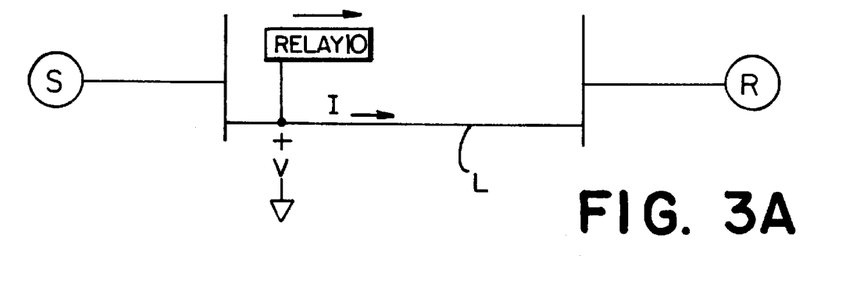
FIGS. 3A–3C are schematic diagrams of a non-series-compensated power supply system, with normal current and voltage (FIG. 3A), fault current and voltage from a fault F1 to the right (FIG. 3B), and fault current and voltage from a fault F2 to the left (FIG. 3C)

Of course, in a typical three-phase power distribution system, there are three lines, each having an AC voltage phasor and an AC current phasor, so a discussion of current flowing in a particular direction is somewhat inaccurate. As is known, and as will be discussed in more detail below, the individual voltage and current phasor (magnitude and angle) measurements $V_A$, $V_B$, $V_C$, $I_A$, $I_B$, $I_C$ from each phase (A–C) of a three phase line 12 (FIG. 1A) are typically employed to calculate one or more voltage, current, and/or impedance 'sequence values' for the line 12, and such sequence values are then examined to determine meaningful system information. Nevertheless, and as seen in FIG. 3A et seq., for the moment, the present disclosure will be with regard to a hypothetical system having a single line and DC-like sources, with the understanding that the principles discussed are equally applicable to the aforementioned sequence values.

Figure 3B:
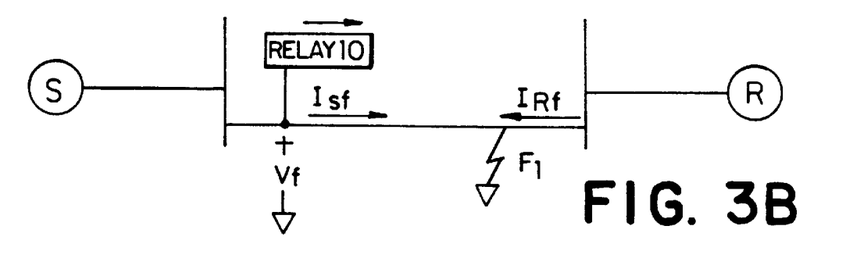

If, as is shown in FIG. 3B, a fault F1 occurs to the right of the relay 10, either on the line L as shown or to the right of the line L (a "forward fault"), fault line current $I_{Sf}$ is produced by the generator S at the left and flows right to the fault F1, and fault line current $I_{Rf}$ is produced by the generator R at the right and flows left to the fault F1. The relay 10: finds that the sampled line current ($I_{Sf}$) increased substantially above the previously measured line current (I) of FIG. 3A; finds that the line voltage (Vf) has decreased substantially below the previously measured line voltage (V) of FIG. 3A, computes a positive lower line impedance $Z_f$ (i.e., with a phasor angle between 0 and 180 degrees); and therefore determines based on the sign of such lower impedance that a fault has occurred somewhere to the right (fault direction determination), either on the line L or beyond the line L. As is also known, based in part on the value of the normal line impedance Z and the value of the fault line impedance $Z_f$, the relay can estimate the distance to the fault (fault location estimation) and take appropriate action.

Figure 3C:
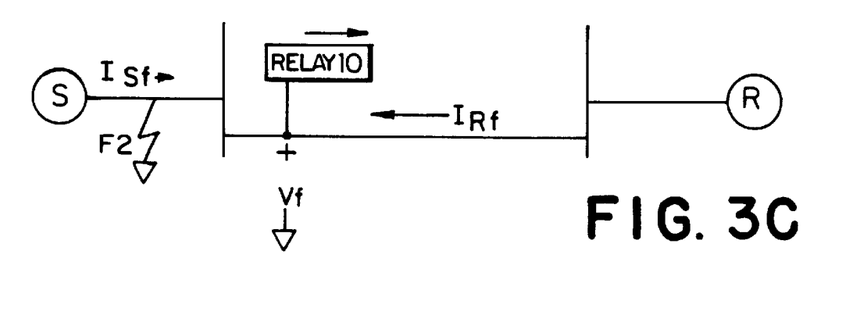

Correspondingly, and as is shown in FIG. 3C, if a fault F2 occurs to the left of the relay 10, either on the line from the generator S (as shown) or elsewhere (a "reverse fault"), fault line current $I_{Sf}$ is still produced by the generator S at the left and flows right to the fault F2, and fault line current $I_{Rf}$ is still produced by the generator R at the right and flows left to the fault F2. Here, however, the relay 10: finds that the sampled line current ($I_{Rf}$) is signed negative, computes a negative line impedance $Z_f$ (i.e., with a phasor angle between 0 and -180 degrees); and therefore determines based on the negative sign of such impedance that a fault has occurred somewhere to the left (fault direction determination), most likely beyond the line L since the relay 10 is at or adjacent the one end of the line L. As before, based in part on the normal line impedance Z and the fault line impedance $Z_f$, the relay can estimate the distance to the fault (fault location estimation) and take appropriate action.

If the fault location is determined by the relay 10 to be within the 'zone of interest' of the relay 10 (i.e., on the line L protected by the relay 10), the relay typically will trip an appropriate breaker 18 (FIG. 1A) to isolate the faulted line L. If the fault location is outside the 'zone of interest' of the relay 10 (i.e., on another line not protected by the relay 10), the relay will typically wait a period of time for another relay closer to the fault (not shown) to isolate the fault. If so isolated, the relay 10 need take no further action. If not so isolated, the relay 10 may, after the wait, decide to trip an appropriate breaker 18 to isolate the fault.

Figure 5A:
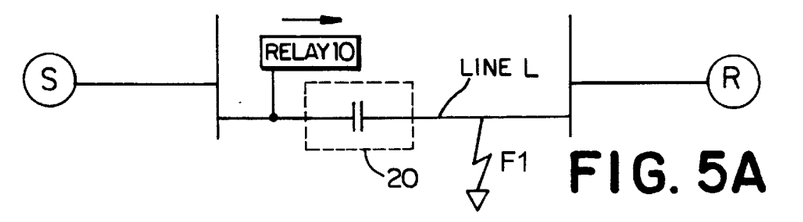
FIGS. 5A and 5B are schematic diagrams of a series-compensated power supply system with a relay to the left of installed series-compensation and a fault F1 to the right (FIG. 5A), and a Δ-fault version of the system (FIG. 5B)

Importantly, the line L shown in FIGS. 3A–3C is not series-compensated. Series capacitance compensation 20 is often added to a transmission line, though, as is shown in FIG. 5A, to cancel out at least a portion of the line impedance caused by line inductance and other positive imaginary impedance component sources. Specifically, a transmission line L may be characterized as having a real (resistive) component $R_L$ and a positive imaginary (inductive) component $X_L$ such that the total impedance $Z_L$ of the line is $R_L + j X_L$. By adding an appropriate amount of series capacitance 20, which has a negative imaginary impedance ($-j X_{CAP}$), the positive imaginary (inductive) component ($+j X_L$) of the line impedance Z is reduced, thereby reducing the magnitude of the line impedance Z. Typically, series capacitance 20 is added to cancel out no more than about sixty percent of the inductive component. It can be assumed, then, that the absolute value of the series capacitance $|(-j X_{CAP})|$ is less than the absolute value of the line inductance $|(+j X_L)|$:

$$|(-jX_{CAP})|<|(-jX_L)|.$$

The introduction of series capacitance 20, however, can interfere with line impedance measurement by a relay 10 under certain circumstances, and in particular with the angle of the measured line impedance as determined by the relay 10. If the sign of the imaginary component becomes inverted due to the presence of the series capacitance 20, a serious problem arises in that the relay 10 will assume that a detected fault is in one line direction, when in fact such fault is in the other line direction.

Figure 4A:
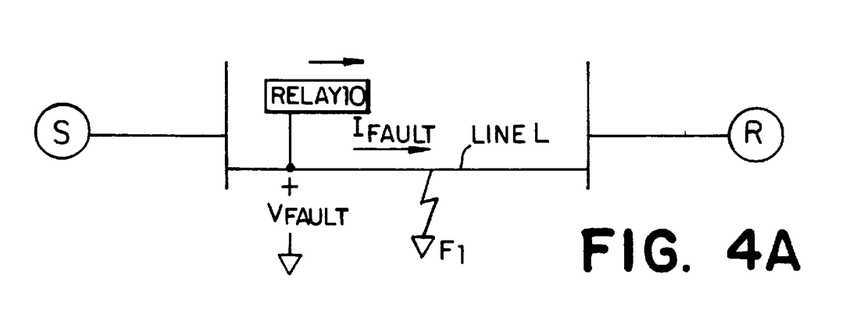
FIGS. 4A–4D are schematic diagrams of a non-series-compensated power supply system with a fault F1 to the right (FIG. 4A), an equivalent representation of the system (FIG. 4B), and a decomposition of the equivalent representation into a pre-fault version of the system (FIG. 4C) and a Δ-fault version of the system (FIG. 4D)
Figure 4B:
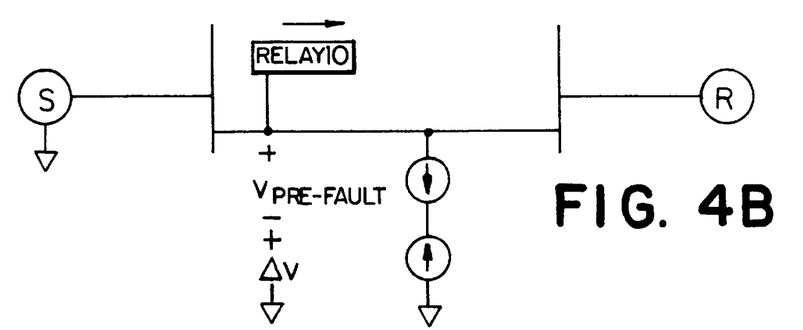
Figure 4C:
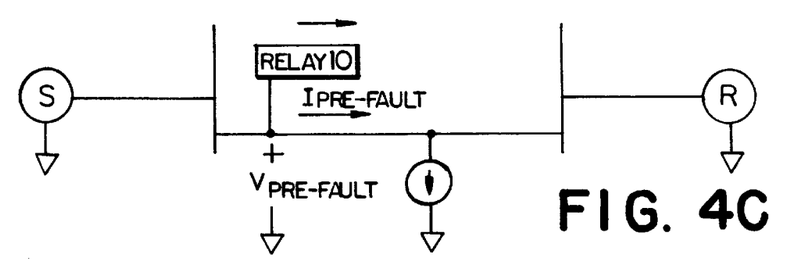

Referring now to FIGS. 4A–4D, where no series capacitance compensation 20 is present, it is seen that in one typical methodology of impedance measurement and sign determination, fault direction determination for a fault F1 (FIG. 4A) in a system is performed by constructing an equivalent representation of the system (FIG. 4B). As seen, the fault F1 is on the line L somewhat to the right of a relay 10 at the left end of line L and looking down and protecting the line L (i.e., toward the right). In the equivalent representation shown in FIG. 4B, the fault F1 is replaced by a pair of voltage sources in series. As may be understood, one voltage source (the upper voltage source in FIG. 4B) causes a voltage equal to the pre-fault line voltage ($V_{PRE\_FAULT}$) to be sensed by the relay 10, and the other voltage source (the lower voltage source in FIG. 4B) causes a voltage ($\Delta V$) to be sensed by the relay 10, where ($\Delta V$) and ($V_{PRE\_FAULT}$) in series is equal to the fault line voltage ($V_{FAULT}$) (FIG. 4A) actually sensed by the relay 10. Accordingly:

$$(\Delta V)=(V_{FAULT})-(V_{PRE\_FAULT})).$$

Figure 4D:
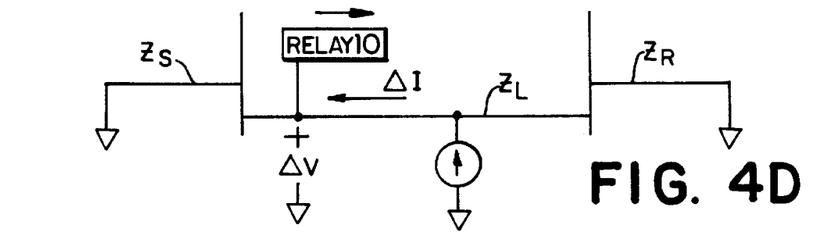

The equivalent system of FIG. 4B may thus be de-composed into a pre-fault version of the system (FIG. 4C) having the sources (S, R) and the pre-fault (upper) voltage source; and a Δ-fault version of the system (FIG. 4D) having only the Δ-fault (lower) voltage source. Of course, the Δ-fault voltage source of FIG. 4D generates a Δ-fault current ΔI which when added to the pre-fault line current ($I_{PRE\_FAULT}$) (FIG. 4C) is equal to the fault line current ($I_{FAULT}$) (FIG. 4A):

$$(\Delta I)\ (I_{FAULT})-(I_{PRE\_FAULT})).$$

Notably, values for ΔV and ΔI can readily be calculated by the relay 10 based on voltage and current fault and pre-fault data already available to such relay 10.

Now, by examining FIG. 4D, it should be apparent that the Δ-impedance seen by the relay 10 is signed negative because ΔI 'flows' in the direction opposite the line of sight of the relay 10. Moreover, it may be generalized that when the Δ-impedance seen by the relay 10 is signed negative, the sensed fault is to the right. Likewise, when the Δ-impedance seen by the relay 10 is signed positive, the sensed fault is to the left. Of course, if the relay 10 of FIG. 4D was instead at the opposite end of the line L and therefore looking in the opposite direction, a signed negative would indicate a fault to left and a signed positive would indicate a fault to the right. Owing to the fact that signing convention may vary, it may be further generalized that when the Δ-impedance seen by a relay 10 is signed one way, the sensed fault is in one direction, and when such Δ-impedance is signed the other way, the sensed fault is in the opposite direction. Moreover, owing to the fact that angles and magnitudes of phasors are in fact being examined (as will be explained in more detail below), it may be further generalized that when the Δ-impedance seen by a relay 10 has an angle of X to X+180 degrees, the sensed fault is in one direction, and when such Δ-impedance has an angle of X+180 to X+360 degrees, the sensed fault is in the opposite direction. Presumably, X is zero, although it could be other angles without departing from the spirit and scope of the present invention.

In addition, if it is assumed in connection with FIG. 4D that source (S) and the remainder of the system to the left has an impedance $Z_S$, the line L has an impedance $Z_L$, and source (R) and the remainder of the system to the right has an impedance $Z_R$, then the value ΔZ of the Δ-impedance calculated by the relay 10 is:

$$\Delta Z = \Delta V / \Delta I = -Z_S.$$

Moreover, it may be generalized that when the fault sensed by the relay 10 is to the right, the value ΔZ of the Δ-impedance calculated by the relay 10 is the negative of the impedance to the left of such relay 10 (i.e., $-Z_S$ in FIG. 4D). Likewise, when the fault sensed by the relay 10 is to the left, the value ΔZ of the Δ-impedance calculated by the relay 10 is the impedance to the right of such relay 10 (i.e., $(Z_L+Z_R)$ in FIG. 4D). Of course, if the relay 10 of FIG. 4D was instead at the opposite end of the line L, a fault to the left would result in $\Delta Z=-Z_R$, and a fault to the right would result in $\Delta Z=(Z_S+Z_L)$.

Figure 5B:
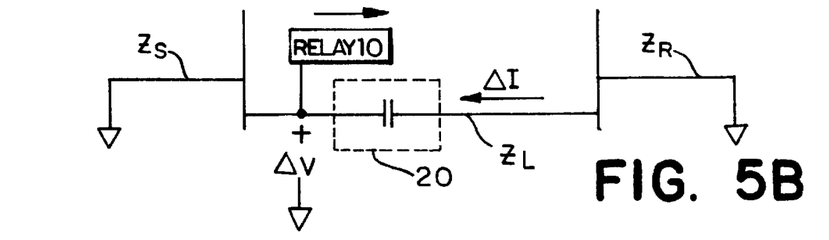

Referring now to FIGS. 5A and 5B, which respectively correspond to FIGS. 4A and 4B, it is seen that series capacitance compensation 20 has been added to the system of FIGS. 4A–4D toward the left side of the line L, and that the relay 10 senses currents and voltages on the left side of the series capacitance 20. Employing the same methodology as was used in connection with FIGS. 4A–4D (and omitting here the steps in connection with FIGS. 4B and 4C), it is seen that the deconstruction of the system of FIG. 5A results in the Δ-fault version of the system as shown in FIG. 5B.

As with the above analysis in connection with FIG. 4D, by examining FIG. 5B, it should be apparent that the Δ-impedance seen by the relay 10 is signed negative because the sensed fault F1 is to the right. In addition, since the sensed fault F1 is to the right of the relay 10, the value ΔZ of the Δ-impedance calculated by the relay 10 (ignoring sign for the moment) is the impedance to the left of such relay 10 (i.e., $-Z_S$ in FIG. 5B).

Figure 6A:
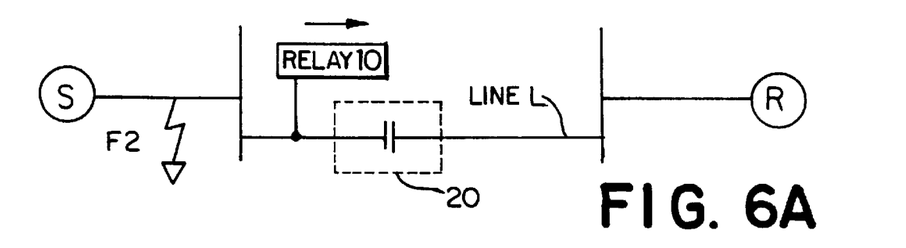
FIGS. 6A and 6B are schematic diagrams which correspond to FIGS. 5A and 5B, where the fault F1 of FIGS. 5A and 5B is replaced by a fault F2 to the left.
Figure 6B:
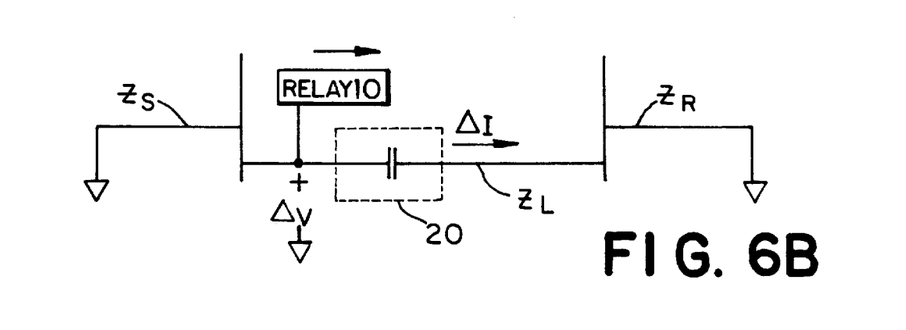

Referring now to FIGS. 6A and 6B, which correspond to FIGS. 5A and 5B, if the fault F1 of FIGS. 5A and 5B is replaced by a fault F2 to the left of the relay 10, as shown, the Δ-impedance is now signed positive. In addition, the value ΔZ of the Δ-impedance calculated by the relay 10 (ignoring sign for the moment) is the Δ-impedance to the right:

$$\Delta Z = -jX_{CAP} + Z_L + Z_R.$$

Now, remembering that $Z_L$ and $Z_R$ each includes a real (resistive) component R and a positive imaginary (inductive) component X such that the total impedance Z is R+j X, the above equation may be re-written as:

$$\Delta Z = -jX_{CAP} + (R_L+jX_L) + (R_R+jX_R).$$

Now, considering the imaginary terms only, it is to be noted that if ($X_{CAP}$) were to be greater than ($X_L+X_R$), the imaginary component of ΔZ would be signed negative, thereby inverting the sign of the imaginary component of such ΔZ (i.e., moving the phasor angle to another quadrant in the real-imaginary plane). As should be understood, such sign inversion is a serious problem in that the relay 10 will assume that a detected fault is in one line direction, when in fact such fault is in the other line direction.

However, and as discussed above, since series capacitance 20 is typically added to cancel out no more than about sixty percent of the inductive component, it can be assumed that the absolute value of the series capacitance $|(-j X_C)|$ is less than the absolute value of the line inductance $|(-j X_L)|$:

$$|(-jX_{CAP})| < |(-jX_L)|.$$

Accordingly, ($X_{CAP}$) would never be greater than ($X_L$), let alone ($X_L+X_R$), and sign inversion is not in fact a concern in the system shown in FIGS. 6A and 6B.

Figure 7A:
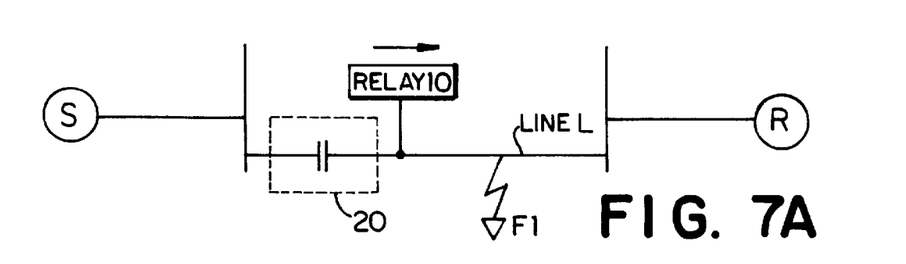
FIGS. 7A and 7B are schematic diagrams which correspond to FIGS. 5A and 5B, where the relay of FIGS. 5A and 5B is moved to the right of the installed series-compensation.
Figure 7B:
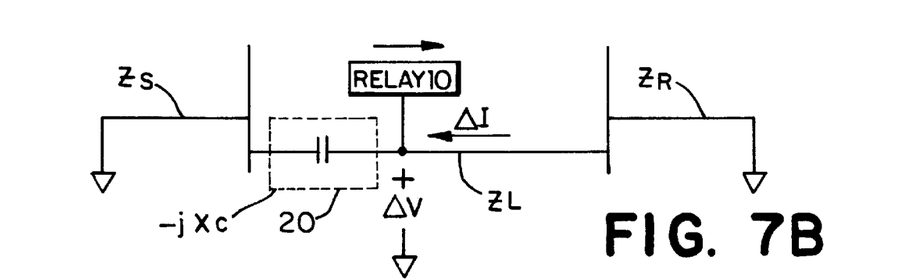

Referring now to FIGS. 7A and 7B, which correspond to FIGS. 5A and 5B, if the relay 10 of FIGS. 5A and 5B is moved to sense currents and voltages on the right side of the series capacitance 20, as shown, the Δ-impedance is expected to be signed negative, as with the system of FIGS. 5A and 5B. However, and as will be explained below, the actual Δ-impedance sensed by the relay 10 may not in fact be signed negative.

In particular, since the fault F1 is to the right of the relay 10, the value ΔZ of the Δ-impedance calculated by the relay 10 is the negative of the Δ-impedance to the left:

$$\Delta Z = -(-jX_{CAP} + Z_S).$$

Now, remembering that $Z_S$ includes a real (resistive) component R and a positive imaginary (inductive) component X such that the total impedance Z is R+j X, the above equation may be re-written as:

$$\Delta Z = -(-jX_{CAP} + (R_S+jX_S)).$$

Now, considering the imaginary terms only, it is to be noted that if ($X_{CAP}$) were to be greater than ($X_S$), the imaginary component of ΔZ would change to negative, thereby inverting the sign of such ΔZ in phasor form (i.e., moving the phasor angle to another quadrant in the real-imaginary plane). As was noted above, such sign inversion is a serious problem in that the relay 10 will assume that a detected fault is in one line direction, when in fact such fault is in the other line direction.

In contrast with the system shown in FIGS. 6A and 6B, however, it can not be assumed that the absolute value of the series capacitance $|(-j X_{CAP})|$ is less than the absolute value of the line inductance $|(+j X_S)|$. Indeed, ($X_{CAP}$) could in fact be greater than ($X_S$), since the value of ($X_{CAP}$) is set to compensate for ($X_L$), not ($X_S$).

One way to avoid the potential problem of sign inversion as illustrated in the system of FIGS. 7A and 7B is to always keep the relay 10 to the left, or 'outside', of the added series compensation capacitance 20, as is shown in FIGS. 5A–6B. Accordingly, any measured impedance which includes such series compensation 20 also includes the compensated line L, as is the case with the system in FIGS. 6A and 6B. However, for practical reasons, it is not in fact always possible to keep the relay 10 outside of the added series compensation 20.

Another way to avoid the potential problem of sign inversion as illustrated in the system of FIGS. 7A and 7B, is to first determine whether the fault is to the right, and if so subtract the actual impedance of the entire series compensation ($-j X_C$) from a calculated Δ-impedance prior to examining the sign thereof. Of course, a method of determining fault direction based on knowledge of the direction of a fault is logically inconsistent.

Moreover, such approach requires knowledge of the actual value of the impedance of the entire series compensation ($-j X_C$) which is likely different from the impedance of the capacitance portion of the series compensation($-j$ $X_{CAP}$). In particular, and as was discussed above in connection with FIG. 2, the installed series capacitance compensation 20 typically includes the capacitance (CAP) and safety devices including a metal oxide varistor (MOV) or other non-linear protection device, a bypass breaker or bypass switch (SW), and a spark gap (SG), among other things. Accordingly, although the capacitance (CAP) has a known impedance value ($-j\ X_{CAP}$), such value will likely be reduced based on the operation of MOV, SW, and/or SG, and can even be reduced toward a substantially zero value. As is known, the actual value ($-j\ X_C$) of the entire series compensation is not can vary during operation in ways not calculable, or at least not calculable in a reasonable manner.

Figure 8:
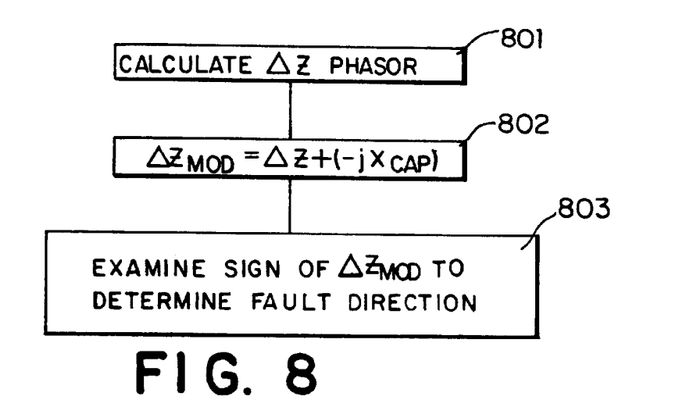
FIG. 8 is a flow diagram detailing steps performed in the method of the present invention.

Nevertheless, it has been found that fault direction may be accurately determined in the circumstance of FIGS. 7A and 7B (i.e., when the relay 10 is to the right, or 'inside', of the added series compensation capacitance 20) by adding the known impedance value of the capacitance (CAP) ($-j\ X_{CAP}$) to a calculated Δ-impedance prior to examining the sign thereof. In effect, and as will be understood, adding ($-j\ X_{CAP}$) offsets the ($-j\ X_C$) component of the calculated ΔZ to ensure that sign inversion does not take place because of such ($-j\ X_C$). In particular, and referring now to FIG. 8, in order to avoid the potential problem of sign inversion as illustrated in the system of FIGS. 7A and 7B, the present invention performs fault direction determination by:

employing the methodology of FIGS. 4A–4D to calculate a phasor for the Δ-impedance ΔZ (step 801);

adding (adjusting) the impedance value of the capacitance (CAP) of the installed series compensation ($-j\ X_{CAP}$) to result in a modified Δ-impedance $ΔZ_{MOD}$ (step 802):

$$ΔZ_{MOD}=ΔZ+(-jX_{CAP});$$

and examining the sign of $ΔZ_{MOD}$ to determine the direction of a sensed fault (step 803).

To see that such method in fact works, first consider the fault F1 as shown to the right of the relay 10 in the system of FIGS. 7A and 7B. Here, since the fault F1 is to the right, the value ΔZ of the Δ-impedance calculated by the relay 10 is the Δ-impedance to the left:

$$ΔZ=-(-jX_C+Z_S),$$

or $$ΔZ=-(-jX_C+(R_S+jX_S)),$$

and $$ΔZ_{MOD}ΔZ+(-jX_{CAP}),$$

or $$ΔZ_{MOD}=-(-jX_C+(R_S+jX_S))+(-jX_{CAP}).$$

Now, considering that ($-j\ X_C$) is going to be some value between zero and ($-j\ X_{CAP}$):

$$|(-jX_{CAP})|≧|(-jX_C)|≧0,$$

((j $X_C$)−(j $X_{CAP}$)) is always less than zero, as is (−(+j $X_S$)). Accordingly, sign inversion will not take place in $ΔZ_{MOD}$ when the fault F1 is to the right of the relay 10 in the system of FIGS. 7A and 7B, where the relay 10 is inside of the installed series compensation 20 and looking down and protecting the line L to the right.

Figure 9A:
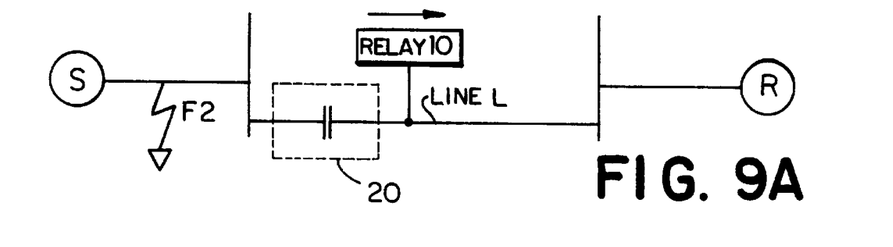
FIGS. 9A and 9B are schematic diagrams which correspond to FIGS. 7A and 7B, where the fault F1 of FIGS. 7A and 7B is replaced by a fault F2 to the left.
Figure 9B:
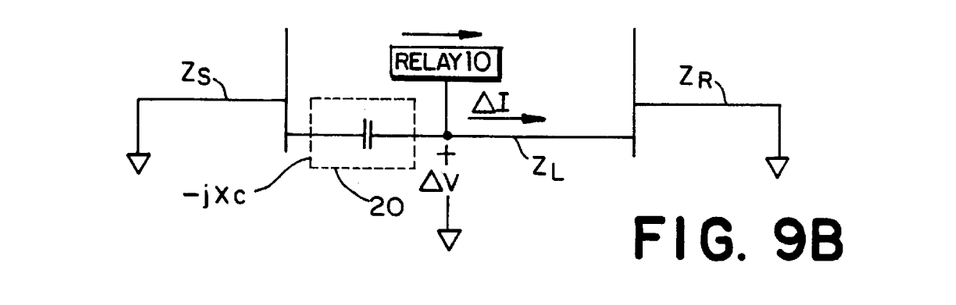

Referring now to FIGS. 9A and 9B, which correspond to FIGS. 7A and 7B, now consider the situation where the fault F1 of FIGS. 7A and 7B is replaced by a fault F2 to the left of the relay 10, as shown. Here, since the fault F2 is to the left, the value ΔZ of the Δ-impedance calculated by the relay 10 is the Δ-impedance to the right:

$$ΔZ=+(Z_L+Z_R),$$

or $$ΔZ=+((R_L+jX_L)+(R_R+jX_R)), \text{ and}$$

$$ΔZ_{MOD}=ΔZ+(-jX_{CAP}),$$

or $$ΔZ_{MOD}=+(R_L+jX_L)+(R_R+jX_R)+(-jX_{CAP}).$$

As should be evident, (+j $X_R$) is greater than zero, as is ((+j $X_L$)+(−j $X_{CAP}$)) since it is assumed that the absolute value of the series capacitance $|(-jX_{CAP})|$ is less than the absolute value of the line inductance $|(+j\ X_L)|$. Accordingly, sign inversion will not take place in $ΔZ_{MOD}$ when the fault F2 is to the left of the relay 10 in the system of FIGS. 7A and 7B and of FIGS. 9A and 9B, where the relay 10 is inside of the installed series compensation 20 and looking down and protecting the line L to the right.

Importantly, based on signing convention, the sign of a calculated Δ-impedance ΔZ may be positive in some instances and negative in others. Accordingly, it may be necessary to subtract, rather than add, the impedance value of the capacitance (CAP) of the installed series compensation ($-j\ X_{CAP}$) from the calculated Δ-impedance ΔZ to result in a modified Δ-impedance $ΔZ_{MOD}$. Generally, the impedance value of the capacitance (CAP) of the installed series compensation ($-j\ X_{CAP}$) is either added or subtracted so as to cancel out the effect of ($-j\ X_C$) on the calculated Δ-impedance ΔZ should ($-j\ X_C$) be present as a component in ΔZ. As was shown above, such added/subtracted ($-j\ X_{CAP}$) produces the correct sign on the resulting modified Δ-impedance $ΔZ_{MOD}$ for any down-line fault (i.e., the fault F1 of FIGS. 7A and 7B), and also for any up-line fault in the opposite direction (i.e., the fault F2 of FIGS. 9A and 9B).

Moreover, the method of the present invention is not restricted to subtracting/adding the impedance value of the capacitance (CAP) of the installed series compensation ($-j\ X_{CAP}$) to result in a modified Δ-impedance $ΔZ_{MOD}$. Instead, and as should be understood based on the above analysis, any capacitance impedance value ($-j\ X_{VALUE}$) may be subtracted from the calculated Δ-impedance ΔZ to result in $ΔZ_{MOD}$, as long as $$|(-jX_{VALUE})|≧|(-jX_{CAP})|.$$

As should be understood, if the above is true, the effect of any ($-j\ X_C$) on the calculated Δ-impedance ΔZ is canceled out. That is, the effect of any ($-j\ X_C$) will never cause the phasor angle of the calculated Δ-impedance $ΔZ_{MOD}$ to move to another quadrant in the real-imaginary plane.

Further, the present invention, though directed to the situation where the relay 10 is inside of the installed series compensation 20, can also be employed where the relay 10 is outside of the installed series compensation 20. Though it may not be necessary to calculate a modified Δ-impedance $ΔZ_{MOD}$ in such outside installation, such modified Δ-impedance $ΔZ_{MOD}$ should still be signed correctly.

As was discussed above, a power system typically has multiple phases, the voltage and current on each phase is typically sinusoidal, and each phase may be series-compensated, among other things. Accordingly, it is known that sequence values may be derived from phase values in order to simplify relay functions including fault direction determination and fault location estimation. In particular, for the three-phase power system shown in FIG. 1A, and for the voltage and current samples $V_A$, $V_B$, $V_C$, $I_A$, $I_B$, $I_C$:

zero sequence voltage may be defined as:

$$V0 = (V_A + V_B + V_C)/3.0;$$

zero sequence current may be defined as:

$$I0 = (I_A + I_B + I_C)/3.0;$$

zero sequence impedance may be defined as:

$$Z0 = V0/I0;$$

positive sequence voltage may be defined as:

$$V1 = (V_A + a\ V_B + a^2 V_C)/3.0;$$

positive sequence current may be defined as:

$$I1 = (I_A + a\ I_B + a2I_C)/3.0;$$

positive sequence impedance may be defined as:

$$Z1 = V1/I1;$$

negative sequence voltage may be defined as:

$$V2 = (V_A + a^2 V_B + a\ V_C)3.0;$$

negative sequence current may be defined as:

$$I2 = (I_A + a^2 I_B + a\ I_C)/3.0;$$

and negative sequence impedance may be defined as:

$$Z2 = V2/I2,$$

where 'a' is a phasor having a magnitude of 1 and an angle of 120 degrees.

By now, it should be understood that in connection with the present invention, one or more sets of sequence values are monitored to determine fault direction. To calculate the Δ-impedance value ΔZ in the positive sequence (ΔZ1), for example, the V1 voltages before and after a fault are noted, as are the I1 currents before and after such fault (i.e., pre-fault and fault, respectively). Accordingly:

$$\Delta V1 = V1_{FAULT} - V1_{PRE\_FAULT};$$

$$\Delta I1 = I1_{FAULT} - I1_{PRE\_FAULT};$$

and $$\Delta Z1 = \Delta V1/\Delta I1.$$

ΔZ0 and ΔZ2 are similarly calculated.

Figure 10:
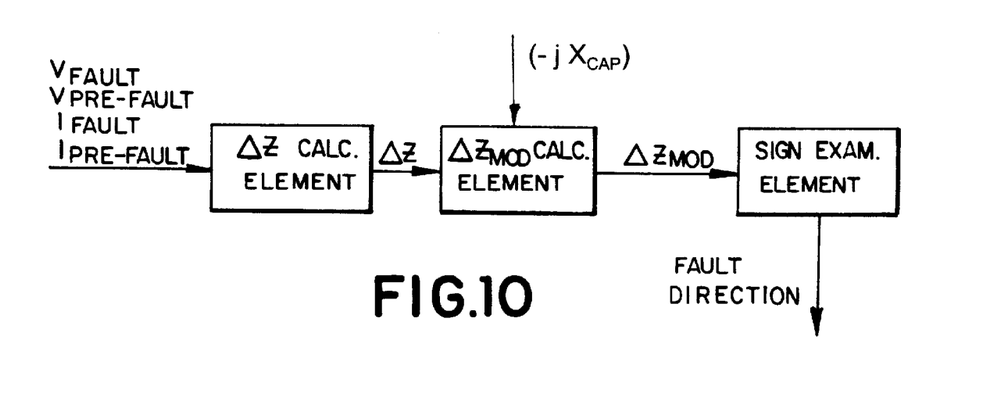
FIG. 10 is a block diagram showing elements which perform the steps of FIG. 8.

Preferably, all of the sets of sequence values are monitored, and ΔZ0, ΔZ1, and ΔZ2 are all evaluated to determine fault direction, among other things. In one embodiment of the present invention hardware elements or software elements embodying ΔZ0, ΔZ1, and ΔZ2 are employed to perform such evaluation, as is seen in FIG. 10.

Likewise, hardware or software elements are further employed to embody each modified Δ-impedance $\Delta Z_{MOD}$ ($\Delta Z0_{MOD}$, $\Delta Z1_{MOD}$, and $\Delta Z2_{MOD}$), as shown. Moreover, hardware or software elements are still further employed to examine the sign of each of ($\Delta Z0_{MOD}$, $\Delta Z1_{MOD}$, and $\Delta Z2_{MOD}$) and to determine the direction of a sensed fault based on such sign, as shown. It is to be appreciated that each element in FIG. 10 corresponds to a step in FIG. 8. Of course, elements such as those in FIG. 10 may perform multiple steps or portions of steps in any of a multitude of arrangements without departing from the spirit and scope of the present invention.

As should be understood, in the case of software elements, such software elements may reside as appropriate programming in the memory 14 and/or processor or DSP 16 of the relay 10 as shown in FIG. 1A. Of course, such elements may also reside in other locations without departing from the spirit and scope of the present invention.

It is also known that:
- the zero sequence values are of interest to determine whether a ground fault of any phase of a line exists;
- the positive sequence values are always present; and
- the negative sequence values are of interest to determine if the phases of a line are un-balanced. Accordingly:

| to determine the presence of this fault: | these sequence values are of particular interest: | | |
|---|---|---|---|
| | zero (0) | positive (1) | negative (2) |
| phase to ground | ✓ | ✓ | ✓ |
| phase to phase | | ✓ | ✓ |
| phase to phase to phase | | ✓ | |
| double phase to ground | ✓ | ✓ | ✓ |
| triple phase to ground | ✓ | ✓ | |

The programming necessary to effectuate the processes performed in connection with the present invention is relatively straight-forward and should be apparent to the relevant programming public. Accordingly, such programming is not attached hereto. Any particular programming, then, may be employed to effectuate the present invention without departing from the spirit and scope thereof.

In the foregoing description, it can be seen that the present invention comprises a new and useful method and directional element for fault direction determination in a capacitance-compensated line. It will be appreciated by those skilled in the art that changes could be made to the embodiments described above without departing from the broad inventive concepts thereof. Thus, for example, except where expressly so limited, the claims are not limited to applications involving three-phase power systems or power systems employing a 50 Hz or 60 Hz frequency. Moreover, the claims are not limited to systems associated with any particular part of a power distribution system, such as a transformer, a feeder, a high power transmission line, etc. It is understood, therefore, that this invention is not limited to the particular embodiments disclosed but it is intended to cover modifications within the spirit and scope of the present invention as defined by the appended claims.

What is claimed is:

1. In an electrical power system including:
   a transmission line for transmitting electrical power;
   series capacitance compensation series-coupled to the transmission line adjacent one end thereof, the series compensation including a capacitance having a value $(-j\ X_{CAP})$; and a protective relay at the one end of the transmission line for monitoring line voltages and line currents on the transmission line;

a method upon sensing a fault for determining a direction of the sensed fault, the method comprising:

calculating a Δ-impedance ΔZ of the line based on the monitored line voltages and line currents before the sensed fault and the monitored line voltages and line currents after the sensed fault;

adjusting the calculated Δ-impedance ΔZ according to the value of the capacitance of the series compensation $(-j\ X_{CAP})$ to result in a modified Δ-impedance ΔZMOD; and examining a phasor angle of ΔZMOD to determine the direction of the sensed fault, the fault being in a first direction if the phasor angle is between X and X+180 degrees, and being in a second direction opposite the first direction if the phasor angle is between X+180 and X+360 degrees.

2. The method of claim 1 wherein the calculating step comprises:

noting a pre-fault line voltage (VPRE_FAULT) prior to the sensed fault;

noting a fault line voltage (VFAULT) after the sensed fault;

noting a pre-fault line current (IPRE_FAULT) prior to the sensed fault;

noting a fault line current (IFAULT) after the sensed fault;

calculating a Δ-voltage (ΔV):

$$(\Delta V) = (VFAULT) - (VPRE\_FAULT));$$

calculating a Δ-current (ΔI):

$$(\Delta I) = (IFAULT) - (IPRE\_FAULT));$$

and calculating the Δ-impedance (ΔZ):

$$\Delta Z = \Delta V / \Delta I.$$

3. The method of claim 2 wherein the series compensation further includes a protective device, the protective device having the effect of reducing a value of total series compensation $(-j\ X_C)$ such that:

$$|(-jX_{CAP})| \geq |(-jX_C)| \geq 0,$$

wherein the calculated Δ-impedance ΔZ includes $(-j\ X_C)$ as a component thereof, and wherein the adjusting step comprises offsetting the $(-j\ X_C)$ component of the calculated Δ-impedance ΔZ to ensure that $(-j\ X_C)$ does not cause sign inversion in ΔZ.

4. The method of claim 3 wherein the adjusting step comprises adjusting the calculated Δ-impedance ΔZ by any capacitive impedance value $(-j\ X_{VALUE})$, wherein:

$$|(-jX_{VALUE})| \geq |(-jX_{CAP})|.$$

whereby $(-j\ X_{VALUE})$ offsets the $(-j\ X_C)$ component of the calculated Δ-impedance ΔZ a sufficient amount to ensure that $(-j\ X_C)$ does not cause sign inversion in ΔZ.

5. The method of claim 1 wherein the line L has a real component $R_L$ and a positive imaginary component $(+j\ X_L)$ such that the line has a total impedance:

$$Z_L = R_L + jX_L,$$

the method further comprising assuming that the absolute value of the capacitance of the series compensation $|(-jX_{CAP})|$ is less than the absolute value of the line inductance $|(+jX_L)|$:

$$|(-jX_{CAP})| < |(+jX_L)|.$$

6. The method of claim 1 wherein the relay is inside of the series compensation on the line.

7. The method of claim 1 wherein the calculating step comprises calculating an impedance Z of the line based on one of zero sequence values (Z0), positive sequence values (Z1), and negative sequence values (Z2) based on the monitored line voltages and line currents.

8. The method of claim 1 comprising:

calculating a zero sequence impedance Z0 of the line based on zero sequence values based on the monitored line voltages and line currents;

calculating a positive sequence impedance Z1 of the line based on positive sequence values based on the monitored line voltages and line currents;

calculating a negative sequence impedance Z2 of the line based on negative sequence values based on the monitored line voltages and line currents;

adjusting each of the calculated impedances Z0, Z1, Z2 according to the value of the capacitance of the series compensation $(-j\ X_{CAP})$ to result in a modified impedance $Z0_{MOD}$, $Z1_{MOD}$, $Z2_{MOD}$, respectively; and examining the phasor angle of each of $Z0_{MOD}$, $Z1_{MOD}$, $Z2_{MOD}$ to determine the direction of the sensed fault.

9. The method of claim 1 wherein X is zero.

10. In combination with an electrical power system including:

a transmission line for transmitting electrical power;

series capacitance compensation series-coupled to the transmission line adjacent one end thereof, the series compensation including a capacitance having a value $(-j\ X_{CAP})$; and a protective relay at the one end of the transmission line for monitoring line voltages and line currents on the transmission line;

an apparatus upon sensing a fault for determining a direction of the sensed fault, the apparatus comprising:

a calculating element calculating a Δ-impedance ΔZ of the line based on the monitored line voltages and line currents before the sensed fault and the monitored line voltages and line currents after the sensed fault;

an adjusting element adjusting the calculated Δ-impedance ΔZ according to the value of the capacitance of the series compensation $(-j\ X_{CAP})$ to result in a modified Δ-impedance $\Delta Z_{MOD}$; and an examining element examining the phasor angle of ΔZMOD to determine the direction of the sensed fault, the fault being in a first direction if the phasor angle is between X and X+180 degrees, and being in a second direction opposite the first direction if the phasor angle is between X+180 and X+360 degrees.

11. The apparatus of claim 10 wherein the calculating element:

notes a pre-fault line voltage (VPRE_FAULT) prior to the sensed fault;

notes a fault line voltage (VFAULT) after the sensed fault;

notes a pre-fault line current (IPRE_FAULT) prior to the sensed fault;

notes a fault line current (IFAULT) after the sensed fault; calculates a Δ-voltage (ΔV):

$$(\Delta V) = (\mathit{VFAULT}) - (\mathit{VPRE\_FAULT});$$

calculates a Δ-current (ΔI):

$$(\Delta I) = (\mathit{IFAULT}) - (\mathit{IPRE\_FAULT});$$

and calculates the Δ-impedance (ΔZ):

$$\Delta Z = \Delta V / \Delta I.$$

12. The apparatus of claim 11 wherein the series compensation further includes a protective device, the protective device having the effect of reducing a value of total series compensation (−j XC) such that:

$$|(-jX_{CAP})| \geq |(-jXC)| \geq 0,$$

wherein the calculated Δ-impedance ΔZ includes (−j XC) as a component thereof, and wherein the adjusting element offsets the (−j XC) component of the calculated Δ-impedance ΔZ to ensure that (−j XC) does not cause sign inversion in ΔZ.

13. The apparatus of claim 12 wherein the adjusting element adjusts the calculated Δ-impedance ΔZ by any capacitive impedance value (−j $X_{VALUE}$), wherein:

$$|(-jX_{VALUE})| \geq |(-jX_{CAP})|.$$

whereby (−j $X_{VALUE}$) offsets the (−j $X_C$) component of the calculated Δ-impedance ΔZ a sufficient amount to ensure that (−j $X_C$) does not cause sign inversion in ΔZ.

14. The apparatus of claim 10 wherein the line L has a real component $R_L$ and a positive imaginary component (+j $X_L$) such that the line has a total impedance:

$$Z_L = R_L + jX_L,$$

the examining element assuming that the absolute value of the capacitance of the series compensation $|(-jX_{CAP})|$ is less than the absolute value of the line inductance $|(+jX_L)|$:

$$|(-jX_{CAP})| < |(+jX_L)|.$$

15. The apparatus of claim 10 wherein the relay is inside of the series compensation on the line.

16. The apparatus of claim 10 wherein the calculating element calculates an impedance Z of the line based on one of zero sequence values (Z0), positive sequence values (Z1), and negative sequence values (Z2) based on the monitored line voltages and line currents.

17. The apparatus of claim 10 comprising:

a zero calculating element calculating a zero sequence impedance Z0 of the line based on zero sequence values based on the monitored line voltages and line currents;

a positive calculating element calculating a positive sequence impedance Z1 of the line based on positive sequence values based on the monitored line voltages and line currents;

a negative calculating element calculating a negative sequence impedance Z2 of the line based on negative sequence values based on the monitored line voltages and line currents;

an adjusting element adjusting each of the calculated impedances Z0, Z1, Z2 according to the value of the capacitance of the series compensation (−j $X_{CAP}$) to result in a modified impedance $Z0_{MOD}$, $Z_{MOD}$, $Z2_{MOD}$, respectively; and an examining element examining the phasor angle of each of $Z0_{MOD}$, $Z1_{MOD}$, $Z2_{MOD}$ to determine the direction of the sensed fault.

18. The apparatus of claim 10 wherein X is zero.

* * * * *